United States Patent
Arita et al.

[11] Patent Number: 6,046,467
[45] Date of Patent: *Apr. 4, 2000

[54] SEMICONDUCTOR DEVICE HAVING CAPACITOR

[75] Inventors: Koji Arita, Osaka; Akihiro Matsuda; Yoshihisa Nagano, both of Suita; Toru Nasu, Kyoto; Eiji Fujii, Ibaraki, all of Japan

[73] Assignee: Matsushita Electronics Corporation, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/667,196

[22] Filed: Jun. 20, 1996

[30] Foreign Application Priority Data

Jun. 22, 1995 [JP] Japan .................... 7-155920

[51] Int. Cl.[7] .................... H01L 29/76
[52] U.S. Cl. .................... 257/295; 257/306; 257/310
[58] Field of Search .................... 257/295, 296, 257/298, 306, 310, 379; 365/145; 437/60, 3

[56] References Cited

U.S. PATENT DOCUMENTS

| | | | |
|---|---|---|---|
| 5,337,279 | 8/1994 | Gregory et al. | 365/201 |
| 5,338,951 | 8/1994 | Argos, Jr. et al. | 257/295 |
| 5,374,578 | 12/1994 | Patel et al. | 437/52 |
| 5,443,688 | 8/1995 | Toure et al. | 216/13 |
| 5,661,319 | 8/1997 | Fujii et al. | 257/295 |

FOREIGN PATENT DOCUMENTS

| | | |
|---|---|---|
| 0 192 989 | 3/1986 | European Pat. Off. . |
| 0 574 275 | 12/1993 | European Pat. Off. . |
| 196 03 288 | 1/1996 | Germany . |

OTHER PUBLICATIONS

Nagata et al., "A GaAs MMIC Chip–Set for Mobile Communications Using On–Chip Ferroelectric Capacitors", IEEE International Solid–State Circuits Conference, (1993), New York, pp. 172 & Digest pp. 1 and 2.

Scott, et al., "Ferroelectric Memory Applications", IEEE 1989 Ultrasonics Symposium, pp. 299–308.

R. Cuppens, "Ferroelectrics for Non–volatile Memories", Microelectronic Engineering 19 (1992), pp. 245–252.

Primary Examiner—Sara Crane
Attorney, Agent, or Firm—McDermott, Will & Emery

[57] ABSTRACT

A capacitor 25 is formed on an insulating layer 21a formed on a semiconductor substrate 21. The end portion of a capacitor insulating layer 23 is positioned between the end portion of a bottom electrode 22 and the end portion of a top electrode 24. A passivation layer 26 for covering the capacitor 25 is formed. Interconnections 28 are connected to the bottom electrode 22 through a first hole 27a and to the top electrode 24 through a second hole 27b. In this way, since the end portion of the capacitor insulating layer 23 is out of the end portion of the top electrode 24, the end portion of the capacitor insulating layer 23 injured by etching does not affect the capacitance.

5 Claims, 3 Drawing Sheets

6,046,467

SEMICONDUCTOR DEVICE HAVING CAPACITOR

BACKGROUND OF THE INVENTION

The present invention relates to a semiconductor device having a capacitor using a ferroelectric layer or dielectric layer having high permittivity as a capacitor insulating layer.

Recently, to realize a nonvolatile RAM of low operating voltage and capable of writing/reading at high speed never known before, technical developments are intensively attempted to form a capacitor using a ferroelectric layer having spontaneous polarization as a capacitor insulating layer, on a semiconductor integrated circuit. At the same time, as the consumer electronic appliances are becoming higher in density, unwanted radiation which is electromagnetic noise released from electronic appliances is posing a serious problem. As the measure to reduce the unwanted radiation, a keen attention has been concentration on the technology of incorporating a capacitor of large capacitance using a ferroelectric layer or a dielectric layer having high permittivity (these layers are commonly called high permittivity dielectric layer hereinafter) as a capacitor insulating layer, into a semiconductor integrated circuit.

A conventional semiconductor device having a capacitor is described below while referring to FIG. 6. An isolation oxide layer 2 is formed on a silicon substrate 1, and a transistor 5 composed of a diffusion layer 3, a gate insulating layer 4a and a gate electrode 4b is formed in a region surrounded by the isolation oxide layer 2. An insulating layer 6 to cover the transistor 5 is formed, and a capacitor 10 composed of a bottom electrode 7, a capacitor insulating layer 8 and a top electrode 9 is formed on the insulating layer 6. The capacitor insulating layer 8 is processed in a same shape as the top electrode 9, and the end portion of the capacitor insulating layer 8 is exactly at the same position of the end portion of the top electrode 9, or at a position of nearly with outside 0.1 μm if the processing precision is taken into consideration. The end portion of the capacitor insulating layer 8 is inside of the end portion or the bottom electrode 7.

To cover the capacitor 10, further, a passivation layer 11 composed of a silicon oxide layer containing phosphorus is formed. Contact holes 12a reaching the diffusion layer 3, and contact holes 12b reaching the bottom electrode 7 and top electrode 9 are formed in the insulating layer 6 and passivation layer 11. Interconnections 13a, 13b are formed through these contact holes 12a, 12b.

In such conventional structure, however, the following problems occur. That is, the end portion of the capacitor insulating layer 8 is likely to be damaged when patterning into a shape of capacitor by dry etching or the like, or it may react with the passivation layer 11 when forming the passivation layer 11. As a result, the crystallinity of the end portion of the capacitor insulating layer 8 deteriorates. Therefore, in the conventional structure in which the capacitor insulating layer 8 and top electrode 9 are identical in shape, the degraded crystallinity portion is contained in the capacitor, and it is likely to cause deterioration of electric characteristics, such as drop of capacitance, increase of leakage current, and drop of dielectric strength.

SUMMARY OF THE INVENTION

It is hence a primary object of the invention to present a semiconductor device having a capacitor free from deterioration of electrical characteristic due to deterioration of crystallinity of end portion of a capacitor insulating layer.

A semiconductor device of the invention comprises a semiconductor substrate on which an integrated circuit element is formed, a capacitor composed of a bottom electrode, a capacitor insulating layer made of a high permittivity dielectric material, and a top electrode, formed on an insulating layer on the semiconductor substrate, a passivation layer for covering the capacitor, and interconnections connected to the bottom electrode through a first hole and to the top electrode through a second hole respectively, wherein the end portion of the bottom electrode and the end portion of the capacitor insulating layer are projecting outside of the end portion of the top electrode.

Preferably, the end portion of the capacitor insulating layer is positioned outside of the first hole, and a third hole is provided at a position overlapping with the first hole in the capacitor insulating layer.

In this way, as the end portion of the capacitor insulating layer is projecting outside of the end portion of the top electrode, the end portion of the capacitor insulating layer lowered in crystallinity is not contained in the capacitor, and therefore, deterioration of electrical characteristics of the capacitor caused by patterning into a shape of capacitor and forming the passivation layer does not occur.

Besides, by disposing a third hole in the capacitor insulating layer, the region near the end portion of the top electrode can be utilized as the hole region for interconnections, so that the capacitor may be further advanced in the scale of integration.

DESCRIPTION OF THE PREFERRED EMBODIMENTS

Figure 1:
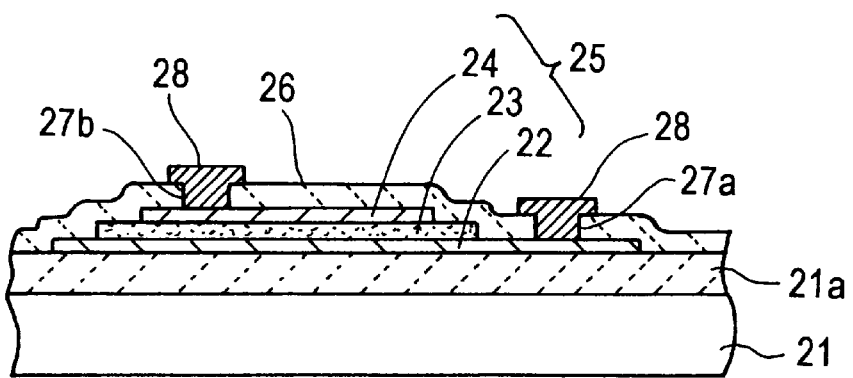
FIG. 1 is a sectional view of a capacitor portion of a semiconductor device in a first embodiment of the invention.

Preferred embodiments of the invention are described below while referring to the drawings.

Figure 6:
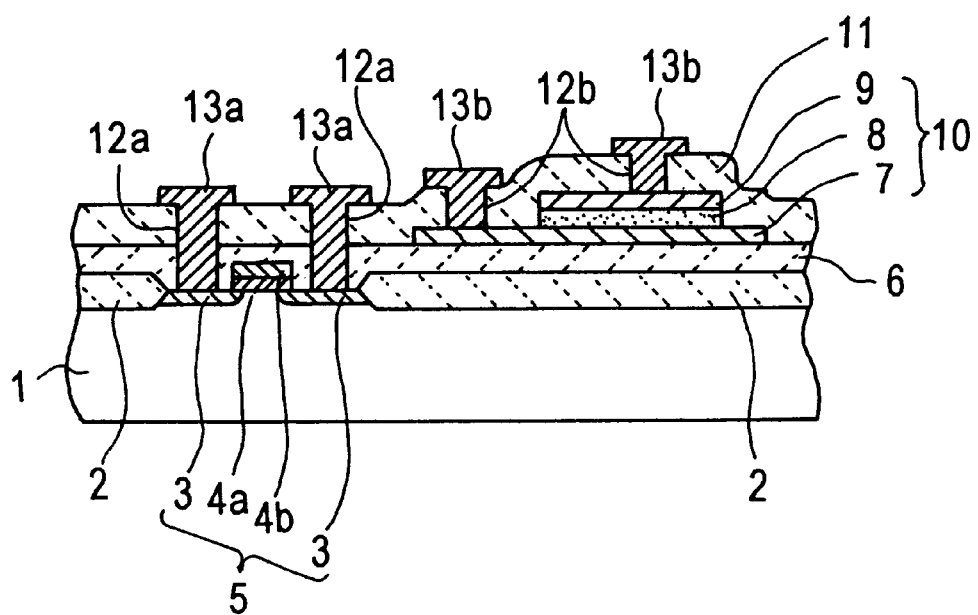
FIG. 6 is a sectional view of a conventional semiconductor device.

FIG. 1 is a sectional view of a capacitor portion of a semiconductor device in a first embodiment of the invention. However, the region in which the integrated circuit element is formed is same as in the prior art shown in FIG. 6, and is hence omitted in the drawing.

As shown in FIG. 1, a bottom electrode 22 of platinum in a thickness of 100 to 300 nm is formed on an insulating layer 21a formed on a semiconductor substrate 21. On the bottom electrode 22, a capacitor insulating layer 23 of $SrBi_2Ta_2O_9$ having lamellar structure in a thickness of 50 to 250 nm, smaller in area than the bottom electrode 22, is formed. The end portion of the capacitor insulating layer 23 is positioned inside of the end portion of the bottom electrode 22. On the capacitor insulating layer 23, a top electrode 24 of platinum in a thickness of 100 to 300 nm, smaller in area than the capacitor insulating layer 23, is formed. The end portion of the top electrode 24 is positioned inside of the end portion of the capacitor insulating layer 23. On a capacitor 25 composed of the bottom electrode 22, capacitor insulating layer 23 and top electrode 24, a passivation layer 26 is formed. In the passivation layer 26, a first hole 27a reaching the bottom electrode 22 and a second hole 27b reaching the top electrode 24 are formed. Through these holes 27a, 27b, interconnections 28 to be connected respectively to the bottom electrode 22 and top electrode 24 are formed.

This capacitor is fabricated in the following manufacturing method. First, on the insulating layer 21a on the semiconductor substrate 21 on which the integrated circuit element is formed, a first platinum film is deposited by sputtering, and a $SrBi_2Ta_2O_9$ film is deposited thereon by spin coating method or CVD method. Consequently, after annealing in oxygen atmosphere in a temperature range of 650 to 900° C., a second platinum film is deposited by sputtering.

In this state, the second platinum film is selectively etched by dry etching method, and the top electrode 24 is formed. Using a resist mask larger in area than the top electrode 24, the $SrBi_2Ta_2O_9$ film is selectively etched, and the capacitor insulating layer 23 is formed. At this time, such a resist mask is used that the end portion of the capacitor insulating layer 23 may be at least 0.1 μm or more larger than the end portion of the top electrode 24. Then, using a resist mask larger in area than the top electrode 24 and capacitor insulating layer 23, the first platinum film is selectively etched by dry etching method, and the bottom electrode 22 is formed. Next, as the passivation layer 26, a silicon oxide film in a thickness of 10 to 800 nm is formed on the entire surface. In an upper position of the bottom electrode 22 not overlapping with the capacitor insulating layer 23, the first hole 27a is formed, and in an upper position of the top electrode 24, the second hole 27b is formed, both in the passivation layer 26. Through these holes 27a, 27b, the interconnections 28 to be connected to the bottom electrode 22 and top electrode 24, respectively, are formed.

In this manufacturing method, after laminating the first platinum film, $SrBi_2Ta_2O_9$ film and second platinum film in the first place, the top electrode 24, capacitor insulating layer 23 and bottom electrode 22 are sequentially formed by etching. Alternatively, after depositing the first platinum film, the bottom electrode 22 may be first formed by etching selectively, and then the $SrBi_2Ta_2O_9$ film and second platinum film may be deposited, and the top electrode 24 and capacitor insulating layer 23 may be formed by etching. Or, the top electrode 24, capacitor insulating layer 23 and bottom electrode 22 may be sequentially formed by depositing each layer and selectively etching, alternately.

Figure 2:
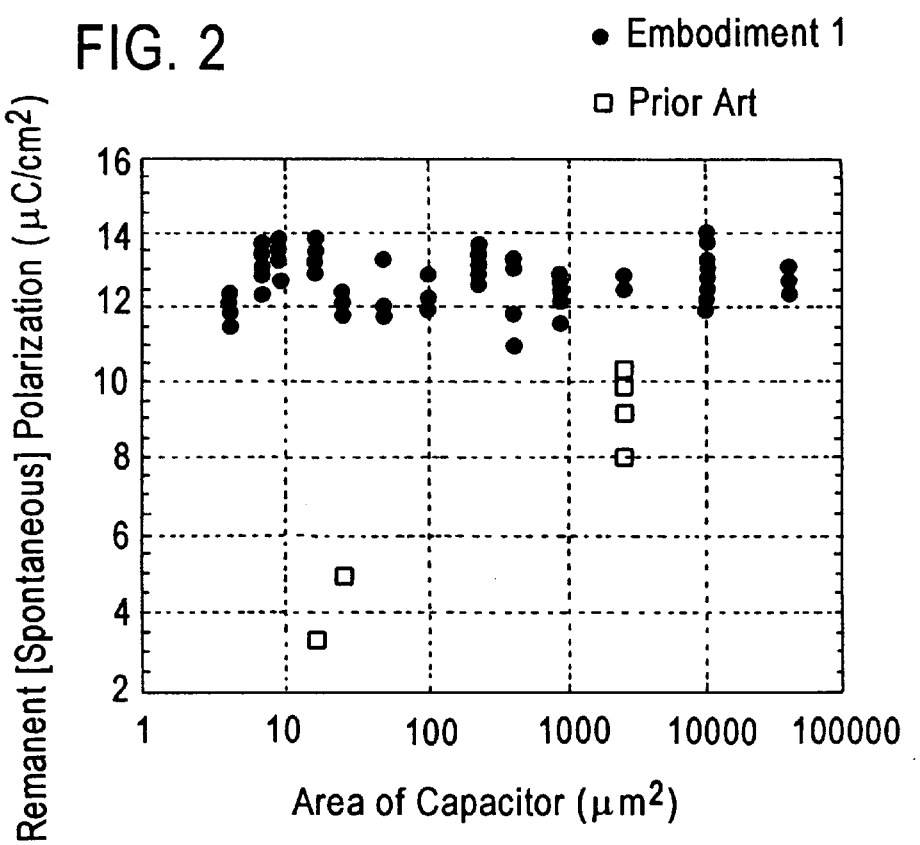
FIG. 2 is a diagram showing the relation between the area of capacitor and remanent polarization.

FIG. 2 shows the relation between the area of capacitor and remanent polarization, by comparing the fist embodiment and the prior art. As shown in FIG. 2, the quantity of remanent polarization in the first embodiment is greater than the quantity of remanent polarization in the prior art. In the prior art, when the capacitor area becomes smaller, the rate of damaged portion occupied in the end portion of the capacitor insulating layer 23 is relatively larger, and hence the quantity of remanent polarization decreased. In the first embodiment, since the damaged portion is outside of the top electrode 24, it has no effect on the capacitance. Therefore, if the capacitor area is smaller, the quantity of remanent polarization does not decrease.

In this structure of the end portion of the capacitor insulating layer 23 projecting outside of the end portion of the top electrode 24, if the end portion of the capacitor insulating layer 23 is damaged at the time of etching, the damaged portion capacitance, to is outside of the end portion of the top electrode 24 to capacitance, and hence the electrical characteristics of the capacitor 25 do not deteriorate. Therefore, increase of leakage current and drop of dielectric strength do not occur, and a semiconductor device having an excellent capacitor hardly causing trouble due to insulation breakdown is realized.

In this embodiment, $SrBi_2Ta_2O_9$ is used as the material for the capacitor insulating layer 23, but other ferroelectric materials and dielectric materials having high permittivity such as $BaTiO_3$, PZT, and PLZT may be also used. In particular, when a high permittivity material of lamellar structure containing Bi is used as the capacitor insulating layer 23, the damage occurring in the end portion of the capacitor insulating layer 23 at the time of dry etching has a large effect on the leakage current, dielectric strength and remanent polarization characteristic of the capacitor, and hence the constitution of the first embodiment is particularly effective.

Figure 3:
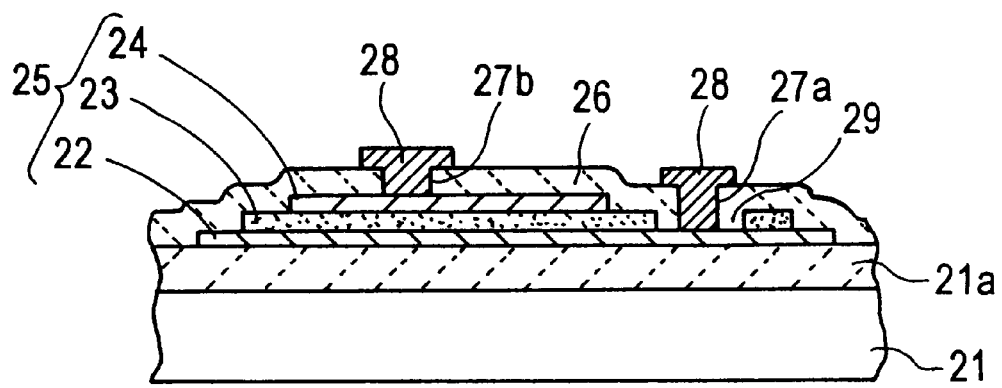
FIG. 3 is a sectional view of a capacitor portion of a semiconductor device in a second embodiment of the invention.

FIG. 3 is a sectional view of a capacitor portion of a semiconductor device in a second embodiment of the invention. In FIG. 3, same members as in the first embodiment shown in FIG. 1 are identified with same reference numerals, and their descriptions are omitted, and only different parts from the first embodiment are described.

As shown in FIG. 3, in the second embodiment, the end portion of the capacitor insulating layer 23 is extended to the outside of the first hole 27a, and a third hole 29 reaching the bottom electrode 22 is formed at a position overlapping with the first hole 27a. In other words, the first hole 27a is formed in the third hole 29 provided in the capacitor insulating layer 23. The manufacturing method of this capacitor is same as in the first embodiment, except that the resist mask which is used when patterning the capacitor insulating layer 23 by dry etching is replaced in order to form the third hole 29.

In the second embodiment, by forming the first hole 27a in the third hole 29, the region near the end portion of the top electrode 24 can be utilized as the hole region for the interconnection 28. Hence, when comparing the first and second embodiments, if the areas of the top electrodes 24 are same, the area of the bottom electrode 22 of the second embodiment can be set smaller than the area of the bottom electrode of the first embodiment. Therefore, the second embodiment is very useful from the viewpoint of high scale integration of capacitor.

The effect not causing deterioration of electrical characteristics of the capacitor is same as in the first embodiment, because the end portion of the capacitor insulating layer 23 in this embodiment is also projecting from the end portion of the top electrode 24.

Figure 4:
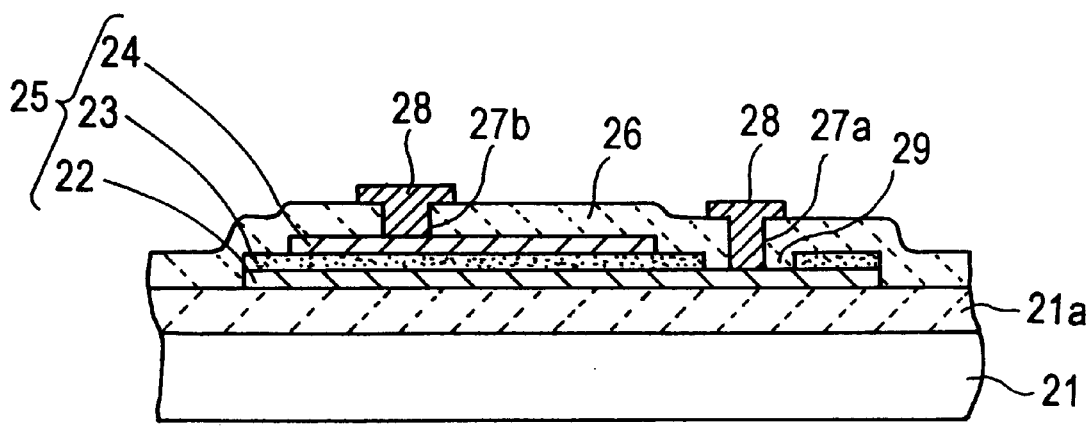
FIG. 4 is a sectional view showing a modified example of the second embodiment.
Figure 5:
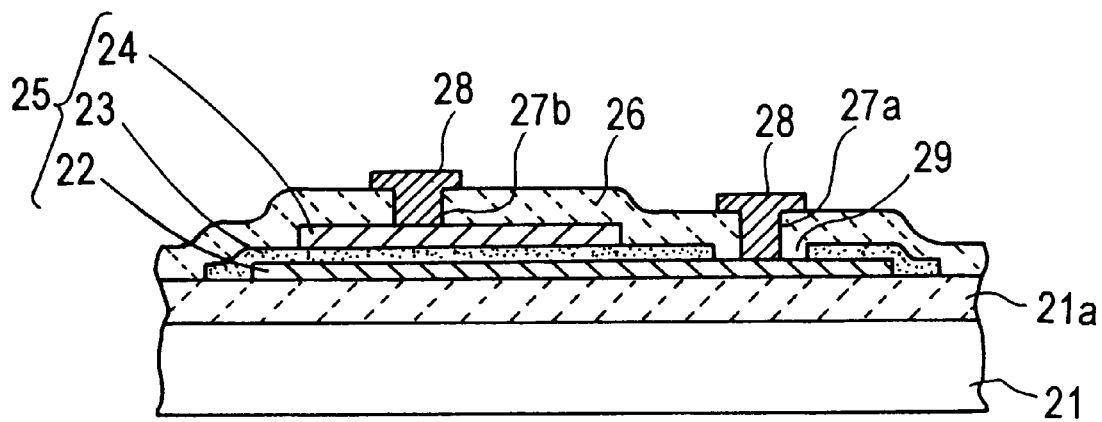
FIG. 5 is a sectional view showing other modified example of the second embodiment.

The dimensional relation of the capacitor insulating layer 23 and bottom electrode 22, and the position relation of the end portions may be also the relations as shown in FIG. 4 and FIG. 5. In FIG. 4, the capacitor insulating layer 23 and bottom electrode 22 are same in size, and both are disposed at the same position. In FIG. 5, the capacitor insulating layer 23 is larger than the bottom electrode 22, and the end portion of the capacitor insulating layer 23 is projecting from the end portion of the bottom electrode 22. In either case, the end portion of the capacitor insulating layer 23 is outside of the end portion of the top electrode 24, and hence the same effects as in the second embodiment are obtained.

The invention is not limited to the illustrated embodiments alone, and various modifications are possible. For example, in the foregoing embodiments, platinum films are used as the bottom electrode and top electrode of the capacitor, but the platinum films may be also replaced by palladium films, other metal films, or conductive oxide films such as $IrO_2$. As the passivation layer, instead of the silicon oxide layer, silicon nitride layer or silicon nitride oxide layer may be also used.

Accordingly, all modifications existing within the true spirit and scope of the invention are included in the scope of the claims of the invention.

What is claimed is:

1. A semiconductor device comprising:

a semiconductor substrate, an insulating layer formed on the semiconductor substrate, a capacitor comprising a bottom electrode formed on said insulating layers said bottom electrode comprising four sides each of which has a corresponding end portion, a capacitor insulating layer made of one of a ferroelectric material and a dielectric material having high permittivity formed on said bottom electrode, said capacitor insulating layer comprising four sides each of which has a corresponding end portion, and a top electrode formed on said capacitor insulating layer, said top electrode comprising four sides each of which has a corresponding end portion, a passivation layer for covering the capacitor, having a first hole formed above the bottom electrode and a second hole formed above the top electrode, and interconnections connected to the bottom electrode through the first hole and to the top electrode through the second hole respectively, wherein each of the end portions of the bottom electrode and each of the end portions of the capacitor insulating layer project outside of the end portions of the top electrode, said capacitor insulating layer having a substantially uniform thickness, and the end portion of the capacitor insulating layer extends beyond the location of said first hole, and the portion of the capacitor insulating layer positioned under the top electrode has a higher crystallinity than the portions of the capacitor insulating layer positioned outside of the top electrode, said device further comprising a third hole formed in a region of the capacitor insulating layer encompassing the first hole, said third hole being larger than said first hole.

2. A semiconductor device of claim 1, wherein the end portion of the capacitor insulating layer is located at the same position of the end portion of the bottom electrode.

3. A semiconductor device of claim 1, wherein the end portion of the capacitor insulating layer extends beyond the outside of the end portion of the bottom electrode.

4. A semiconductor device comprising:

a semiconductor substrate, an insulating layer formed on the semiconductor substrate, a capacitor comprising a bottom electrode formed on said insulating layer, a capacitor insulating layer made of one of a ferroelectric material and a dielectric material having high permittivity formed on said bottom electrode, and a top electrode formed on said capacitor insulating layer, a passivation layer for covering the capacitor, having a first hole formed above the bottom electrode and a second hole formed above the top electrode, and interconnections connected to the bottom electrode through the first hole and to the top electrode through the second hole respectively, wherein an end portion of the bottom electrode and an end portion of the capacitor insulating layer are both projecting outside of an end portion of the top electrode, said end portion of said capacitor insulating layer extends beyond the outside of the end portion of the bottom electrode, said capacitor insulating layer having a substantially uniform thickness, and the end portion of the capacitor insulating layer extends beyond the location of said first hole, said device further comprising a third hole formed in a region of the capacitor insulating layer encompassing the first hole, said third hole being larger than said first hole.

5. A semiconductor device comprising:

a semiconductor substrate, an insulating layer formed on the semiconductor substrate, a capacitor comprising a bottom electrode formed on said insulating layer, a capacitor insulating layer made of one of a ferroelectric material and a dielectric material having high permittivity formed on said bottom electrode, and a top electrode formed on said capacitor insulating layer, a passivation layer for covering the capacitor, having a first hole formed above the bottom electrode and a second hole formed above the top electrode, and interconnections connected to the bottom electrode through the first hole and to the top electrode through the second hole respectively, wherein an end portion of the bottom electrode and an end portion of the capacitor insulating layer are both projecting outside of an end portion of the top electrode, and an end portion of said capacitor insulating layer extends beyond the outside of an end portion of the bottom electrode.

* * * * *